US011056271B2

(12) United States Patent
Park et al.

(10) Patent No.: US 11,056,271 B2
(45) Date of Patent: Jul. 6, 2021

(54) COIL PATTERN AND FORMATION METHOD THEREFOR, AND CHIP ELEMENT HAVING SAME

(71) Applicant: MODA-INNOCHIPS CO., LTD., Ansan-Si (KR)

(72) Inventors: In Kil Park, Seongnam-Si (KR); Seung Hun Cho, Siheung-Si (KR); Gyeong Tae Kim, Ansan-Si (KR); Jun Ho Jung, Siheung-Si (KR); Sang Jun Park, Hwaseong-Si (KR)

(73) Assignee: MODA-INNOCHIPS CO., LTD.

( * ) Notice: Subject to any disclaimer, the term of this patent is extended or adjusted under 35 U.S.C. 154(b) by 404 days.

(21) Appl. No.: 16/077,725

(22) PCT Filed: Mar. 13, 2017

(86) PCT No.: PCT/KR2017/002661
§ 371 (c)(1),
(2) Date: Aug. 13, 2018

(87) PCT Pub. No.: WO2017/160032
PCT Pub. Date: Sep. 21, 2017

(65) Prior Publication Data
US 2020/0335254 A1    Oct. 22, 2020

(30) Foreign Application Priority Data

Mar. 17, 2016    (KR) .................... 10-2016-0032204

(51) Int. Cl.
*H01F 27/28*    (2006.01)
*H01F 27/29*    (2006.01)
(Continued)

(52) U.S. Cl.
CPC ......... *H01F 27/2804* (2013.01); *H01F 27/29* (2013.01); *H01F 27/323* (2013.01);
(Continued)

(58) Field of Classification Search
CPC .. H01F 17/006; H01F 27/2804; H01F 27/292; H01F 41/042; H01F 2017/0066; C25D 5/02; Y10T 29/7902
See application file for complete search history.

(56) References Cited

U.S. PATENT DOCUMENTS 9,236,171 B2 * 1/2016 Ito ........................ H01F 5/003
2005/0083607 A1    4/2005 Sasaki et al.
(Continued)

FOREIGN PATENT DOCUMENTS

CN    101079407 A    11/2007
CN    101567314 A    10/2009
(Continued)

OTHER PUBLICATIONS

Written Opinion for PCT/KR2017/002661 dated Jun. 7, 2017.
International Search Report for PCT/KR2017/002661 dated Jun. 7, 2017.

*Primary Examiner* — Robert J Pascal
*Assistant Examiner* — Kimberly E Glenn
(74) *Attorney, Agent, or Firm* — Renaissance IP Law Group LLP

(57) ABSTRACT

Provided is a coil pattern formed on at least one surface of a substrate and including a first plating film formed on the substrate and a second plating film formed to cover the first plating film, a method of forming the coil pattern, and a chip device provided with the coil pattern.

17 Claims, 8 Drawing Sheets

(51) Int. Cl.
*H01F 27/32* (2006.01)
*H01F 41/04* (2006.01)
*H01L 23/64* (2006.01)

(52) U.S. Cl.
CPC ......... *H01F 41/041* (2013.01); *H01L 23/645* (2013.01); *H01F 2027/2809* (2013.01)

(56) References Cited

U.S. PATENT DOCUMENTS

2007/0222550 A1* 9/2007 Fujiwara ............. H01F 17/0033
                                                                      336/200
2015/0170823 A1   6/2015   Jeong et al.
2016/0071643 A1   3/2016   Heo et al.

FOREIGN PATENT DOCUMENTS

| | | |
|---|---|---|
| CN | 103377880 A | 10/2013 |
| CN | 104733154 A | 6/2015 |
| JP | H0566936 U | 9/1993 |
| JP | H07135114 A | 5/1995 |
| JP | H11204361 A | 7/1999 |
| JP | 2001267166 A | 9/2001 |
| JP | 2003197438 A | 7/2003 |
| JP | 2004319571 A | 11/2004 |
| JP | 2007128928 A | 5/2007 |
| JP | 2009010137 A | 1/2009 |
| JP | 2009117546 A | 5/2009 |
| JP | 2012089765 A | 5/2012 |
| JP | 2015111694 A | 6/2015 |
| KR | 20070032259 A | 3/2007 |
| KR | 20140072796 A | 6/2014 |
| KR | 101539879 B1 | 7/2015 |
| KR | 101598295 B1 | 2/2016 |
| KR | 20160029293 A | 3/2016 |
| TW | 486584 B | 5/2002 |
| TW | 516049 B | 1/2003 |
| TW | 201506967 A | 2/2015 |

* cited by examiner

COIL PATTERN AND FORMATION METHOD THEREFOR, AND CHIP ELEMENT HAVING SAME

TECHNICAL FIELD

The present disclosure relates to a coil pattern and a method of forming the same, and more particularly, to a coil pattern capable of increasing inductance and decreasing resistance, a method of forming the coil pattern, and a chip device having the coil pattern.

BACKGROUND

Power inductors, one of chip devices, are mainly provided in power supply circuits, such as a DC-DC converter in a portable apparatus. Such power inductors have been increasingly used in place of wound-type choke coils according to higher frequency applications and downsizing of the power supply circuits. In addition, power conductors have been developed in directions of downsizing, high currents, low resistance, or the like according to the downsizing and multi-functionality of portable apparatuses.

In general, power conductors each are configured to include a body formed of a ferrite material, a substrate provided in the body, a coil pattern formed on the substrate, and an external electrode formed outside the body to be connected to the coil pattern, and the like. In this case, the coil pattern may be formed through a plating process on at least one surface of the substrate. Electrical characteristics of such power inductors may be determined by material properties of the body, the structure of the coil pattern, or the like.

Meanwhile, the coil pattern has inductance and resistance which are adjusted according to the height and cross-sectional area thereof. The shape control of the coil pattern is important to realize optimal characteristics, and it is most ideal to form the cross-sectional shape of the coil pattern in a rectangular shape to realize optimal inductance and resistance. That is, it is most ideal that the coil pattern have a lower surface, an upper surface and side surfaces formed on edges of the lower and upper surfaces, wherein the lower, upper, and side surfaces have rectangular shapes which form right angles with each other. However, the coil pattern formed through a plating process by using a metal ion has no choice but to be formed such that edges between the upper and side surfaces are roundly formed. That is, the coil pattern may be formed in a round shape in which plating rates of central and edge portions differ and thereby, no edges are present between the upper and side surfaces. In this case, the higher the height of the coil pattern, the narrower the width of the upper surface, and the wider the width of the round region. That is, the round region may be formed between the upper and side surfaces by the amount of the difference in widths of the upper and lower surfaces. Through common plating methods, it is only possible to achieve the ratio of the width of the upper surface to the width of the lower surface of approximately 0.1:1 to approximately 0.5:1.

Accordingly, when the coil pattern is formed in the same height as that in an ideal shape in consideration of the inductance of the coil pattern, the inductance of the coil pattern is the same, but the resistance of the coil pattern is increased due to the loss of an upper edge portion. In addition, when the coil pattern is formed in the same cross-sectional area as that in an ideal shape in consideration of the resistance of the coil pattern, the inductance of the coil pattern is decreased due to the increase of the height of the coil pattern.

DISCLOSURE

Technical Problem

The present disclosure provides a coil pattern capable of improving inductance and decreasing resistance and a method of manufacturing the same.

The present disclosure also provides a coil pattern capable of increasing the ratio of the width of an upper surface to the width of a lower surface and a method of manufacturing the same.

Technical Solution

In accordance with an exemplary embodiment, a coil pattern formed on at least one surface of a substrate includes: a first plating film formed on the substrate; and a second plating film formed to cover the first plating film.

The coil pattern may be formed in a spiral shape on each of both surfaces of the substrate, and at least a portion of the first plating film may be connected through a conductive via hole formed on the substrate.

The first plating film may be formed to have a width gradually decreasing from a lower surface thereof contacting the substrate to an upper surface thereof.

The first plating film may be formed such that a ratio of a width of the upper surface thereof to a width of the lower surface thereof is approximately 0.2:1 to approximately 0.9:1.

The first plating film is formed such that a ratio of the width of the lower surface thereof to a height of the lower surface thereof is approximately 1:0.7 to approximately 1:4.

A ratio of the width of the lower surface of the first plating film to the width of the lower surface of the second plating film may be approximately 1:1.2 to 1:2, and a ratio of the width of the lower surface of first plating film to the distance between adjacent first plating films may be approximately 1.5:1 to approximately 3:1.

A ratio of the width of the upper surface of the second plating film to the width of the lower surface of the second plating film may be approximately 0.5:1 to approximately 0.9:1.

The coil pattern may have a resistance value of approximately 101% to approximately 110% with respect to a resistance value of a design in which a ratio of a width of the upper surface of the coil pattern to the width of the lower surface of the coil pattern is 1:1.

The coil pattern may be formed to have a width gradually increased or decreased from an innermost portion thereof toward an outermost portion thereof.

In accordance with another exemplary embodiment, a method of forming a coil pattern including: forming a mask pattern having a predetermined shape on at least one surface of a substrate; forming a first plating film on the substrate between the mask patterns; etching the first plating film after removing the mask patterns; and forming a second plating film so as to cover the first plating film.

The coil pattern may be formed in a spiral shape on each of both surfaces of the substrate, and at least a portion of the first plating film may be connected through a conductive via hole formed on the substrate.

The first plating film may be formed to have a width gradually decreasing from a lower surface thereof contacting the substrate to an upper surface thereof.

The first plating films may be etched by performing at least one isotropic etching and at least one inclined etching.

The first plating film may be formed such that a ratio of a width of the upper surface thereof to a width of the lower surface thereof is approximately 0.2:1 to approximately 0.9:1.

Etching of the first plating film may be performed in at least two intervals in which ratios of the isotropic etching to the inclined etching are differently set.

The coil pattern may be formed to have a width gradually increased or decreased from an innermost portion thereof toward an outermost portion thereof.

In accordance with yet another exemplary embodiment, a chip device includes: a body; at least one substrate provided in the body; at least one coil pattern formed on at least one surface of the substrate; and an insulating layer formed between the coil pattern and the body, wherein the coil pattern is formed to have a width gradually increased or decreased from an innermost portion thereof toward an outermost portion thereof.

The coil pattern comprises: a first plating film formed on the substrate; and a second plating film formed to cover the first plating film.

The first plating film may be formed such that a ratio of a width of the upper surface thereof to a width of the lower surface thereof is approximately 0.2:1 to approximately 0.9:1.

At least some regions of the substrate may be removed and the removed regions may be filled with the body.

At least two substrates may be provided to be laminated in a thickness direction of the body, and coil patterns respectively formed on the two or more substrates are connected in series or in parallel.

Advantageous Effects

A coil pattern according to exemplary embodiments has a second plating film formed to cover a first plating film formed to have a predetermined inclination. Accordingly, the final coil pattern has vertical side surfaces and upper corners with small rounds to thereby have an almost rectangular shape. Thus, in comparison with typical arts in which a coil pattern is formed through a single process, it is possible to increase inductance and decrease resistance at the same height as that in the typical arts.

BRIEF DESCRIPTION OF THE DRAWINGS

Exemplary embodiments can be understood in more detail from the following description taken in conjunction with the accompanying drawings, in which.

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
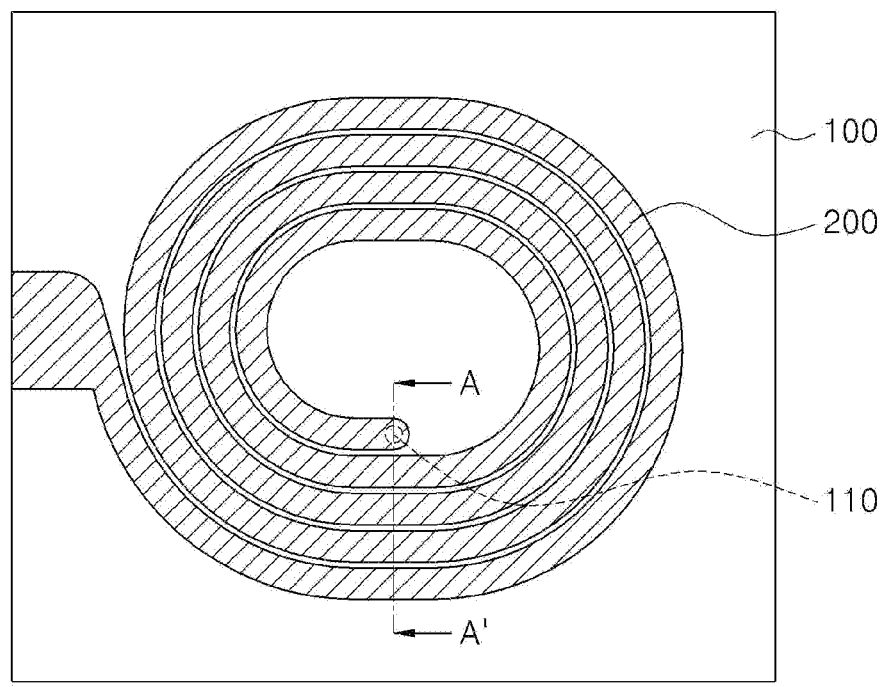
FIGS. 1 to 4 are plan views and cross-sectional views in accordance with exemplary embodiments.
Figure 2:
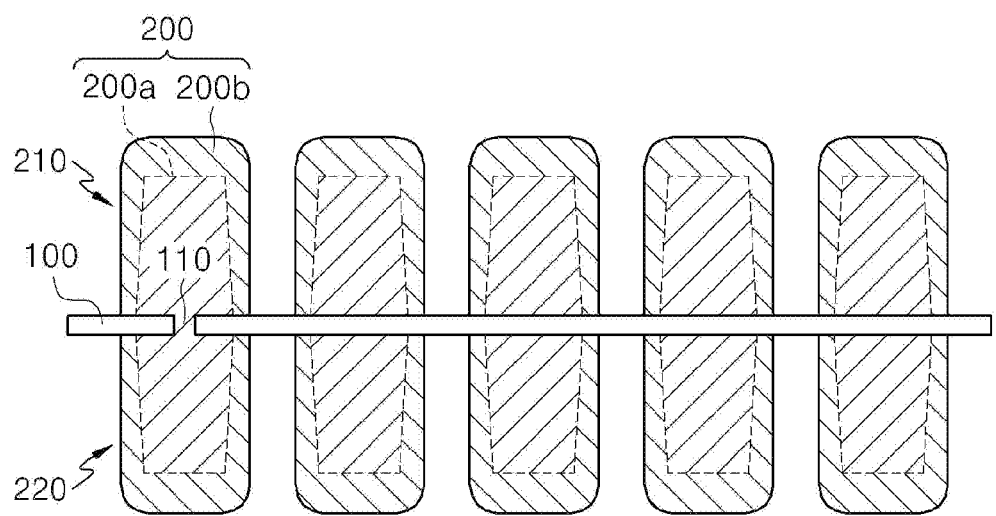
Figure 3:
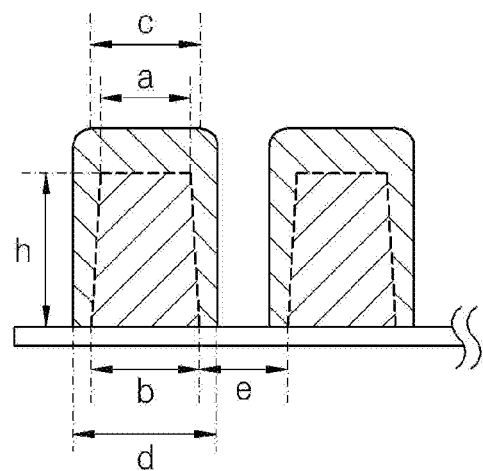
Figure 4:
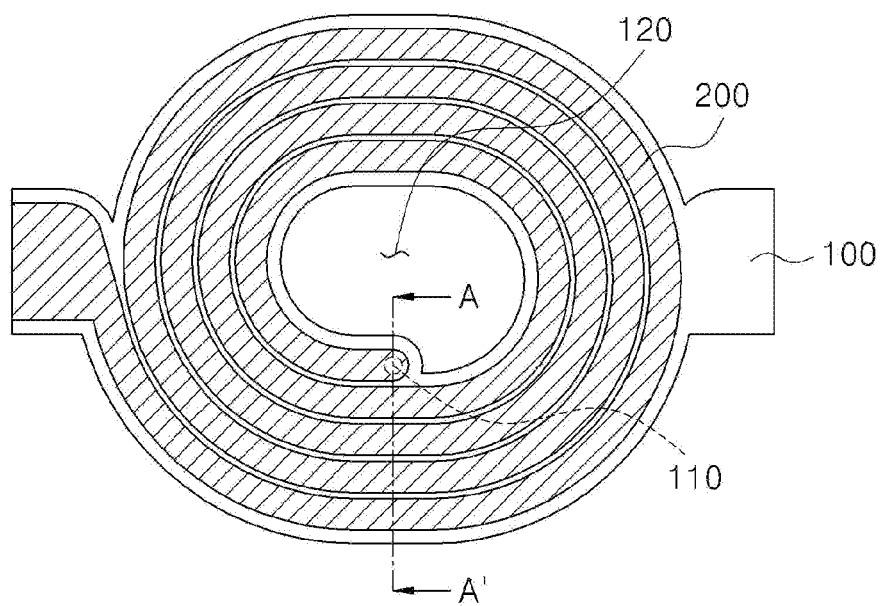

FIG. 1 is a plan view of a coil pattern in accordance with a first exemplary embodiment, and FIG. 2 is a cross-sectional view taken along line A-A' of FIG. 1. In addition, FIG. 3 is a partial cross-sectional view of a coil pattern, and FIG. 4 is a plan view of a coil pattern in accordance with a second exemplary embodiment.

Referring to FIGS. 1 to 4, a coil pattern 200 in accordance with exemplary embodiments may be formed on at least one surface of a substrate 100. That is, the coil pattern 200 may also be formed on only one surface of the substrate 100 and on one and the other surfaces of the substrate 100. In an exemplary embodiment, as illustrated in FIG. 2, the case in which the coil patterns 210 and 220 are respectively formed on one and the other surfaces of the substrate 100 will be mainly described.

The substrate 100 may be provided in a shape in which a metal foil is attached to upper and lower portions of a base having a predetermined thickness. Here, the base may include, for example, glass-reinforced fiber, plastic, metal ferrite. That is, a copper clad lamination (CCL) in which a copper foil is bonded to glass-reinforced fiber may be used as the substrate 100, and the substrate 100 may be formed such that a copper foil is bonded to plastic such as polyimide or a copper foil is bonded to metal ferrite. Also, when the coil pattern 200 is formed on one and the other surfaces of the substrate 100, at least one conductive via 110 may be formed in a predetermined region of the substrate 100. The conductive via 110 is formed and thereby, two coil patterns 210 and 220 (200) respectively formed on one and the other surfaces of the substrate 100 may be electrically connected with each other. The conductive via 110 may be formed through a method or the like in which a via (not shown) passing through the substrate 100 in the thickness direction is formed, and then, when the coil pattern is formed, the via is filled through a plating process or filled with a conductive paste. However, when the coil pattern is formed, the via may favorably be filled through plating. In this case, at least one of the coil patterns 200 may be grown from the conductive via 110, and accordingly, at least one of the conductive via 110 and the coil pattern 200 may be integrally formed. Also, at least a portion of the substrate 100 may be removed. For example, as illustrated in FIG. 4, in the substrate 100, the remaining region except for the region overlapping the coil pattern 200 may be removed. For example, the substrate 100 inside the coil pattern 200 formed in a spiral shape may be removed to form a through hole 120, and the substrate 100 outside the coil pattern 200 may be removed. That is, the substrate 100 may be formed, for example, in a racetrack shape along the outer shape of the coil pattern 200 and in a straight-line shape along the shape of an end portion of the coil pattern 200. In this case, an end portion of the coil pattern 200 formed on one surface of the substrate 100 and an end portion of the coil pattern 200 formed on the other surface of the substrate 100 are formed on regions facing each other, and the end portions of the coil pattern 200 may be connected to an external electrode by being applied later to a power inductor or the like. Meanwhile, when a predetermined region of the substrate 100 except for the region overlapping the coil pattern 200, the substrate 100 may maintain the width greater than that of the coil pattern 200. That is, the substrate 100 may remain in a predetermined width vertically under the coil pattern 200. For example, the substrate 100 may be formed so as to protrude by approximately 0.3 μm from the coil patterns 210 and 220.

The coil patterns 210 and 220 (200) may be formed on at least one surface of the substrate 100 and may favorably be formed on both surfaces of the substrate 100. These coil patterns 210 and 220 may be formed in a spiral shape in the outward direction from a predetermined region, for example, the central portion of the substrate 100, and the two coil patterns 210 and 220 formed on the substrate 100 may be connected to form one inductor. That is, the coil patterns 210 and 220 may be formed in a spiral shape outside a predetermined width of the central portion of the substrate 100 and may be connected to each other through a conductive via 110 formed on the substrate 100. Meanwhile, when the through hole 120 is formed on the central portion of the substrate 100, the coil pattern 200 may be formed in a spiral shape from the outside of the through hole 120. Here, the upper coil pattern 210 and the lower coil pattern 220 may be formed in the same shape as each other and may be formed in the same height as each other. Also, the coil patterns 210 and 220 may also be formed to overlap each other, and the coil pattern 220 may also be formed in a region in which the coil pattern 210 is not formed. Meanwhile, end portions of the coil patterns 210 and 220 may be formed in a straight-line shape so as to outwardly extend and formed so as to have a width greater than those of other regions. Such coil patterns 210 and 220 are formed through plating, and the coil patterns 210 and 220 and the conductive via 110 may be formed of a material including at least one of silver (Ag), copper (Cu) and a copper alloy, but are not limited thereto. The coil patterns 210 and 220 (200) may be formed at least two times higher than the thickness of the substrate 100. For example, the substrate 100 may be formed in a thickness of approximately 30 μm to approximately 70 μm, and the coil patterns 210 and 220 may be formed in a height of approximately 50 μm to approximately 300 μm.

Also, the coil patterns 210 and 220 according to an exemplary embodiment may be formed in a double structure. That is, as illustrated in FIG. 2, the coil patterns 210 and 220 may include a first plating film 200a and a second plating film 200b formed to cover the first plating film 200a. Here, the second plating film 200b is formed to cover the upper and side surfaces of the first plating film 200a and may be formed in a greater thickness on the upper surface than that on the side surfaces. Meanwhile, the first plating film 200a is formed such that the side surfaces thereof have a predetermined inclination, and the second plating film 200b is formed such that the side surfaces thereof have an inclination smaller than those of the side surfaces of the first plating film 200a. That is, the first plating film 200a is formed such that the side surfaces thereof have a dull angle from the surface of the substrate 100 outside the first plating film 200a, and the second plating film 200b is formed so as to have an angle smaller than that of the first plating film 200a, and to favorably have a right angle. The first plating film 200a may be formed such that the ratio of the width a of the upper surface thereof to the width b of the lower surface thereof is within the range of approximately 0.2:1 to approximately 0.9:1, and may favorably be formed such that the ratio a:b is within the range of approximately 0.4:1 to approximately 0.8:1. Also, the first plating film 200a may be formed such that the ratio of the width b to the height h of the lower surface thereof is within the range of approximately 1:0.7 to approximately 1:4, and may favorably be within the range of approximately 1:1 to approximately 1:2. That is, the first plating film 200a may be formed to have a width gradually decreasing from the lower surface thereof to the upper surface thereof, and thus, a predetermined inclination may be formed on the side surfaces thereof. In order that the first plating film 200a has a predetermined inclination, an etching process may be performed after a first plating process. Also, the second plating film 200b formed to cover the first plating film 200a is formed to have an approximately rectangular shape which has vertical side surfaces and a small round region between the upper and side surfaces thereof. In this case, the shape of the second plating film 200b may be determined according to the ratio of the width a of the upper surface of the first plating film 200a to the width b of the lower surface of the first plating film 200a, that is, the ratio a:b. For example, the greater the ratio of the width a of the upper surface of the first plating film 200a to the width b of the lower surface of the first plating film 200a, the greater the ratio of the width c of the upper surface of the second plating film 200b to the width d of the lower surface of the second plating film 200b. However, when the ratio of the width a of the upper surface of the first plating film 200a to the width b of the lower surface of the first plating film 200a exceeds approximately 0.9:1, the second plating film 200b has an upper surface having a greater width than that of a lower surface thereof and side surfaces which may form an acute angle with the substrate 100. Also, when the ratio a:b of the width of the upper surface of the first plating film 200a to the width of the lower surface of the first plating film 200a is less than approximately 0.2:1, the second plating film 200b may have an upper surface roundly formed from a predetermined region on the side surfaces thereof. Accordingly, the ratio of the widths of the upper and lower surfaces of the first plating film 200a is favorably adjusted such that the width of the upper surface is formed greater and the side surfaces are vertically formed. Meanwhile, the ratio of the width b of the lower surface of the first plating film 200a to the width d of the lower surface of the second plating film 200b may be approximately 1:1.2 to approximately 1:2, and the ratio of the width b of the lower surface of the first plating film 200a to the distance e between the first plating films 200a adjacent to each other may be approximately 1.5:1 to approximately 3:1. Of course, the second plating films 200b are not in contact with each other. As such, the coil pattern 200 composed of the first and second plating films 200a and 200b may have the ratio c:d of the width of the upper surface to the width of the lower surface of approximately 0.5:1 to approximately 0.9:1, and the ratio may favorably be approximately 0.6:1 to approximately 0.8:1. That is, the outer shape of the coil pattern 200, in other words, the outer shape of the second plating film 200b may have the ratio of the width of the upper surface to the width of the lower surface of approximately 0.5:1 to approximately 0.9:1. Accordingly, in the coil pattern 200, round regions in upper surface may have a size less than approximately 0.5 with respect to an ideal rectangular shape forming a right angle. For example, the round regions may have a size equal to or greater than approximately 0.001 and less than approximately 0.5 with respect to an ideal rectangular shape forming a right angle. In addition, the coil pattern 200 according to an exemplary embodiment has a smaller change in resistance than that of the ideal rectangular shape. For example, when the resistance of a coil pattern having the ideal rectangular shape is 100, the coil pattern 200 according to an exemplary embodiment may maintain approximately 101 to approximately 110. That is, according to the shape of the first plating film 200a and the shape of the second plating film 200b which varies according to the shape of the first plating film 200a, the resistance of the coil pattern 200 according to an exemplary embodiment may be maintained at approximately 101% to 110% with respect to the resistance of the ideal rectangular-shaped coil pattern. Meanwhile, the second plating film 200b may be formed by using the same plating solution as that used for the first plating film 200a. For example, the first and second plating films 200a and 200b may be formed by using a plating solution which is based on copper sulfate and sulfuric acid and in which chlorine (Cl) and organic compounds are added in ppm units to improve product platibility. A carrier including polyethylene glycol (PEG) and a polish may be used as the organic compounds to improve uniformity, electro-deposition property, and polishing property.

Figure 5:
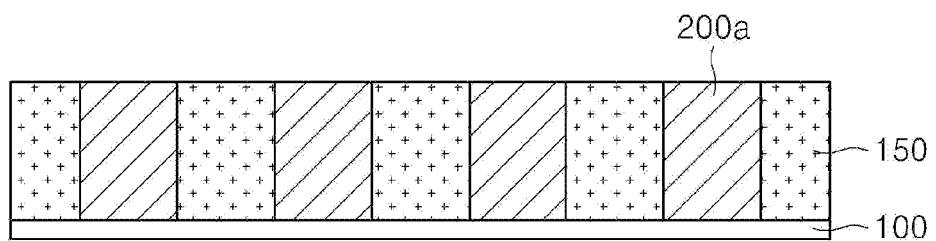
FIGS. 5 to 7 are cross-sectional views for describing a method of forming a coil pattern in accordance with an exemplary embodiment.
Figure 6:
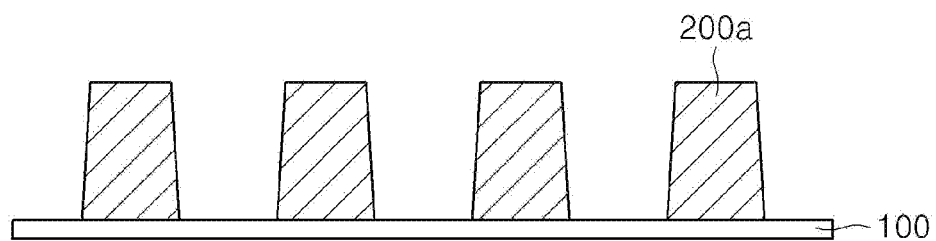
Figure 7:
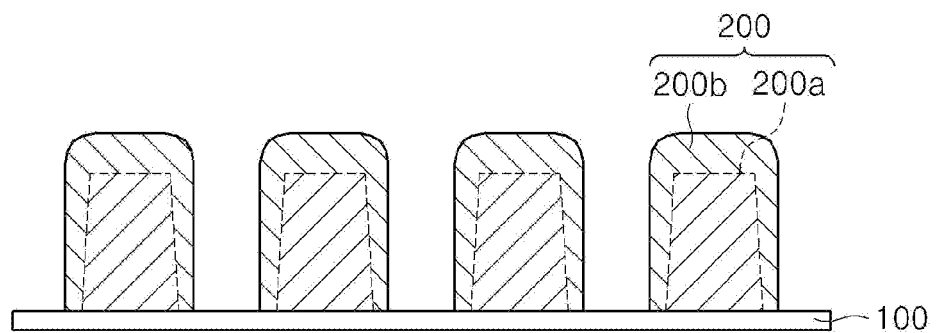

FIGS. 5 to 7 are cross-sectional views for describing a method of forming a coil pattern in accordance with an exemplary embodiment. Although FIGS. 5 to 7 illustrate the case in which a coil pattern 200 is formed on one surface of a substrate 100, the coil pattern 200 may be formed on each of one and the other surfaces of the substrate 100.

Referring to FIG. 5, a mask pattern 150 with a predetermined shape is formed on at least one surface of a substrate 100, and then, a first plating film 200a is formed between the mask patterns 150 on the substrate 100.

The substrate 100 may be provided in a shape in which a metal foil is attached to at least one surface of a base having a predetermined thickness. For example, a copper clad lamination (CCL) in which a copper foil is bonded to glass-reinforced fiber may be used as the substrate 100, and the substrate 100 may be formed such that a copper foil is bonded to plastic such as polyimide or a copper foil is bonded to metal ferrite. Meanwhile, a via may be formed on a predetermined region of the substrate 100, and remaining regions except for the region in which a coil pattern will be formed may also be removed.

In addition, the mask pattern 150 may be formed by performing exposition and development processes after a photosensitive film is formed on the substrate 100. For example, the mask pattern 150 with a predetermined shape may be formed by performing exposition and development processes after a photosensitive film with a predetermined thickness is attached on to the substrate 100. Here, the mask pattern 150 may be formed in predetermined height and width according to the height and width of the first plating film 200a to be formed on the substrate 100. That is, the mask pattern 150 may be formed in the same height and width as the height and width of the first plating film 200a. For example, the mask pattern 150 may be formed in a height of approximately 20 µm to approximately 300 µm and a width of approximately 1 µm to approximately 150 µm. However, the mask pattern 150 may also be formed higher or lower than the height of the first plating film 200a. Also, the mask pattern 150 may be formed in a shape of a coil pattern. For example, the mask pattern 150 may be formed in a spiral shape such that a predetermined region of the substrate 100 is exposed. In order to form the mask pattern 150 in a spiral shape having a predetermined width, the photosensitive film may be exposed through an exposition process using a mask having the same shape as the spiral shape and developed.

The first plating film 200a is formed through a first plating process on the substrate 100 exposed by the mask pattern 150. The first plating film 200a may be formed in a height of approximately 50% to approximately 100% of the height of the final target coil pattern. That is, the first plating film 200a may be formed in the same height as or a lower height than the height of the final target coil pattern. However, it is undesirable because when the height of the first plating film 200a is too low, the first plating film 200a may not have a predetermined inclination after being etched, and when the height of the first plating film is too high, a plating process and an etching process require a long time and material loss is caused. That is, the first plating film 200a may be formed to have a predetermined aspect ratio so as to have a predetermined inclination by being etched. In this case, the first plating film 200a may be formed to have an aspect ratio, that is, the ratio of the width to the height of approximately 1:0.7 to approximately 1:4. That is, the first plating film 200a may have the width-to-height ratio of approximately 0.7 to approximately 4, and when the width-to-height ratio is not more than approximately 0.7, an inclined surface of the first plating film 200a may not be easily formed. Also, the first plating film 200a may be formed of, for example, copper, and for this, a plating solution based on, for example, copper sulfate ($CuSO_4$) and sulfuric acid ($H_2SO_4$) may be used. Furthermore, in order to improve platibility, an organic compound of chlorine (Cl) may be added in ppm units to the plating solution. Here, the organic compound may improve the uniformity, electro-deposition property, and polishing property of the first plating film 200a by using a carrier including polyethylene glycol (PEG) and a polish. Meanwhile, the plating process for forming the first plating film 200a may be performed at temperatures of approximately 20° C. to approximately 30° C.

Referring to FIG. 6, the first plating film 200a is etched after the mask pattern 150 is removed such that the side surfaces of the first plating film 200a have predetermined inclinations.

The mask pattern 150 is removed by using a material having a large etching selection ratio with respect to the first plating film 200a. Accordingly, the mask pattern 150 may be removed almost without removing the first plating film 200a. Also, after the mask pattern 150 is removed, a metal foil under the mask pattern 150 may be removed. That is, the first plating film 200a is retained and the mask pattern 150 is removed, and then the metal foil exposed by the first plating film 200a is removed to expose the substrate 100.

Subsequently, the first plating film 200a is etched to thereby make the side surfaces of the first plating film 200a have predetermined inclinations. That is, the width of the first plating film 200a gradually decreases from the lower surface toward the upper surface of the first plating film 200a, and accordingly, the first plating film 200a is etched so as to have predetermined inclinations from the upper surface toward the lower surface. In this case, the first plating film 200a retains a spiral shape and is etched such that regions adjacent to the first plating film 200a, that is, the side surfaces of the first plating film 200a have predetermined inclinations. Meanwhile, according to the ratio of the width a of the upper surface of the first plating film 200a to the width b of the lower surface of the first plating film 200a, the shape of the final coil pattern formed later through a second plating process may be determined. Accordingly, the first plating film 200a may be etched such that the ratio a:b is approximately 0.2:1 to approximately 0.9:1 and favorably, may be etched such that the ratio a:b is approximately 0.4:1 to approximately 0.8:1. In addition, in order to etch the first plating film 200a, an etching solution which includes sulfuric acid and hydrogen peroxide and is usable at approximately 20° C. to approximately 40° C. may be used. The etching solution is injected to the first plating film 200a through a certain nozzle and thereby, the first plating film 200a is etched. Here, the etching process may be performed by using a perpendicular injection nozzle for isotropic etching and an inclined-injection nozzle for inclined etching. That is, the first plating film 200a may be etched by using an etching apparatus provided with at least one perpendicular-injection nozzle and at least one inclined-injection nozzle. Here, perpendicular injection means the injection of the etching solution to the substrate 100 perpendicular to the substrate 100 and inclined injection means the injection in which the occupancy of the perpendicular injection is very low or zero and the etching solution is injected in, for example, a circular shape or a fan shape with a large angle. Also, in the etching process, the first plating film 200a may be etched such that the substrate 100 on which a plurality of first plating films 200a are formed is moved in one direction, and the etching solution is injected to the first plating film 200a on the moving substrate 100 by using a plurality of injection nozzles which is provided on at least one side of the substrate 100. Here, at least one or more injection nozzles may be provided in a widthwise direction perpendicular to the moving direction of the substrate 100 according to the injection angle and the injection pressure of the etching solution, and at least one or more injection nozzles may be provided in the moving direction of the substrate 100. Accordingly, while the substrate 100 is moved, each of the isotropic etching process by using the perpendicular-injection nozzle and the inclined etching process by using the inclined-injection nozzle may be performed at least once on the same region. Meanwhile, the etching process may be performed in at least 2 divided intervals in which different ratios of the isotropic etching through the perpendicular-injection to the inclined etching through the inclined injection are set. For example, when divided into two intervals, the etching process may be performed such that approximately 40% to approximately 90% of perpendicular injection and approximately 10% to approximately 60% of inclined injection are performed in the first interval, and approximately 10% to approximately 50% of perpendicular injection and approximately 50% to approximately 90% of inclined injection are performed in the second interval. Here, in the first interval, the perpendicular injection is performed equal to or more than the inclined injection, and in the second interval, the perpendicular injection is performed equal to or less than the inclined injection. That is, in the first interval, etching is mainly performed by the perpendicular injection, and in the second interval, etching is mainly performed by the inclined injection. Meanwhile, the arrangement of the nozzles may be configured from at least one perpendicular injection, at least one perpendicular injection and inclined injection, at least one inclined injection and perpendicular injection, and at least one inclined injection. Also, in the first and second intervals, the etching speeds may be approximately 0.5 m/min to approximately 2.1 m/min, the etching pressures for forming hitting force may be approximately 0.5 bar to approximately 2.0 bar, and the hitting force may be changed by changing oscillation. Meanwhile, after the inclined etching process, the first plating film 200a and the distance between the plating films 200a may have a ratio of approximately 1:1.5 to approximately 1:3. That is, the width of the lower surface of the first plating film 200a and the distance between the adjacent lower surfaces of first plating film 200a may have a ratio of approximately 1:1.5 to approximately 1:3. Referring to FIG. 7, a second plating film 200b is formed on the first plating film 200a which is completely etched through inclined etching. That is, the second plating film 200b is formed to cover the first plating film 200a which is completely etched through inclined etching. Accordingly, the coil pattern 200 which has, for example, a spiral shape may be formed in a predetermined width and height. Here, the ratio of the first plating film 200a which is completely etched through inclined etching and the second plating film 200b formed to cover the first plating film 200a may be approximately 1:1.2 to approximately 1:2. Meanwhile, the second plating film 200b may be formed by using the same plating solution as that used for the first plating film 200a. For example, the second plating films 200b may be formed by using a plating solution which is based on copper sulfate and sulfuric acid and in which chlorine (Cl) and organic compounds are added in ppm units to improve product platibility. Also, the second plating film 200b is formed at a temperature of approximately 20° C. to approximately 30° C. The coil pattern 200 formed as described above may have the ratio of the width of the upper surface thereof to the width of the lower surface thereof of approximately 0.5:1 to approximately 0.9:1, and favorably, approximately 0.6:1 to approximately 0.8:1. That is, the fraction of the round regions at corners with respect to an ideal rectangular shape may be approximately 0.1 to approximately 0.5. Furthermore, this coil pattern has the greater ratio of the width of the upper surface to the width of the lower surface greater than that of the coil pattern formed through a typical plating process, that is, approximately 0.1:1 to approximately 0.5:1.

Figure 8:
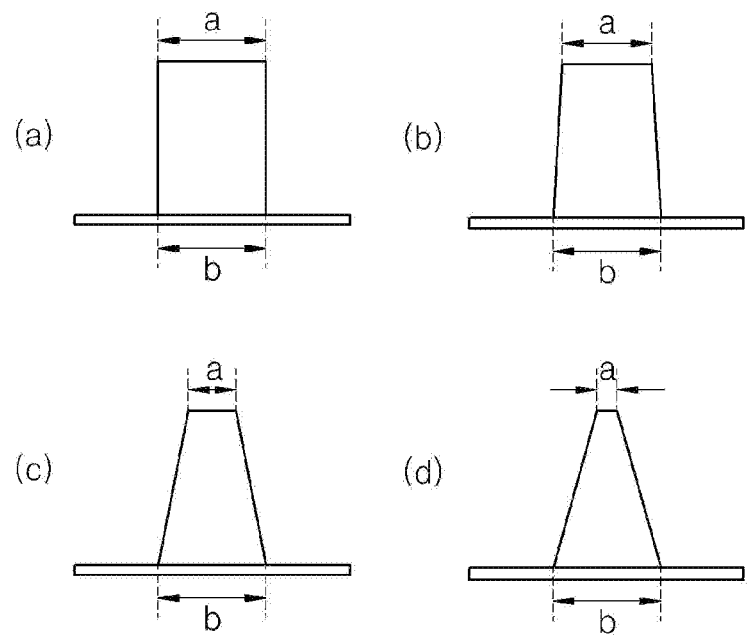
FIGS. 8 to 10 are cross-sectional views illustrating shapes of coil patterns in accordance with inclinations of a first plating film.
Figure 9:
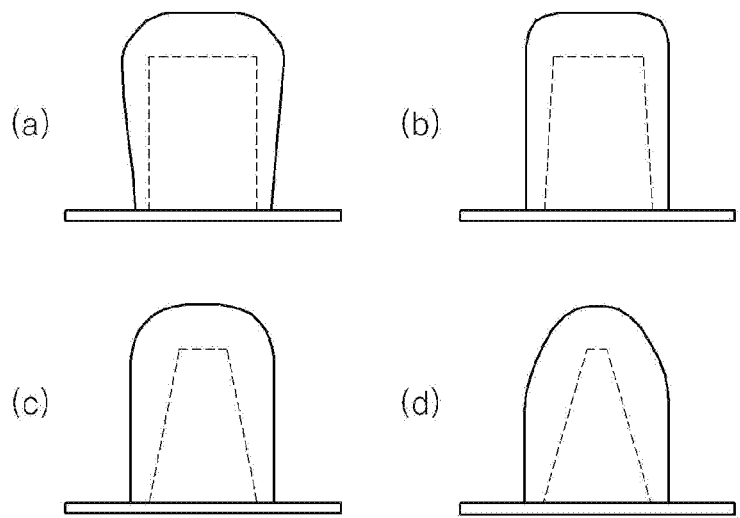
Figure 10:
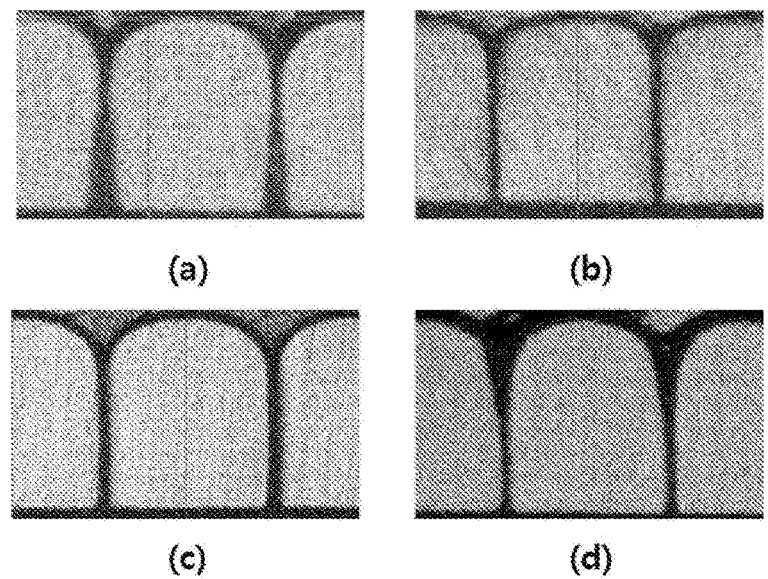

FIG. 8 is a schematic cross-sectional view illustrating various examples of a pattern shape formed through inclined etching of a first plating film, and FIGS. 9 and 10 are respectively a schematic cross-sectional view and a cross-sectional photograph which illustrate shapes of a second plating film through inclined etching on the first plating film having various shapes.

(a) to (d) of FIG. 8 are cross-sectional views of the first plating film in which the ratio of the width a of the upper surface to the width b of the lower surface are respectively approximately 1:1, approximately 0.8:1, approximately 0.4:1, and approximately 0.2:1. That is, (a) of FIG. 8 is a cross-sectional view in which the ratio of the width a of the upper surface to the width b of the lower surface is maintained at approximately 1:1 because the inclined etching of the first plating film is not performed, and (b) of FIG. 8 to (d) of FIG. 8 are cross-sectional views in which the ratio of the width a of the upper surface to the width b of the lower surface is maintained at approximately 0.8:1, approximately 0.4:1, and approximately 0.2:1.

As illustrated in (a) of FIG. 9 and (a) of FIG. 10, when the ratio a:b of a first plating film is approximately 1:1, the final plating pattern in which a second plating film is formed to cover the first plating film has a width gradually increasing in the upward direction and is formed in a shape in which upper corners thereof are substantially rounded. That is, the thickness of the second plating film formed on the side surfaces of the first plating film gradually increases from the lower portion toward the upper portion and thereby, the side surfaces have a shape which is not a vertical shape but an upwardly expanding shape and the upper corner portions are substantially rounded.

Meanwhile, as illustrated in (b) of FIG. 9 and (b) of FIG. 10, when the ratio a:b of a first plating film is approximately 0.8:1, the final plating pattern has almost vertical side surfaces, and small round regions are formed on upper corners thereof such that the final plating pattern is formed in an almost rectangular shape. Here, the ratio of the upper surface to the round regions of upper corners is formed to be equal to or greater than approximately 9:1. That is, when the ideal rectangular shape formed by a first virtual line upwardly extending from side surfaces and a second virtual line horizontally extending from the upper surface is assumed, the ratio of the widths of the upper surface to the width of the round regions is formed to be equal to or greater than approximately 9:1.

In addition, as illustrated in (c) of FIG. 9 and (c) of FIG. 10, when the ratio a:b of a first plating film is approximately 0.4:1, the final plating pattern has almost vertical side surfaces, but round regions formed on upper corners thereof are formed to be greater than those in (b) of FIG. 9 and (b) of FIG. 10. However, in comparison with the case in which the ratio a:b is approximately 1:1, the pattern shape becomes similar to a rectangle. Here, the ratio of the upper surface and the round regions on upper corners may be formed to be approximately 5:1 to approximately 9:1.

However, as illustrated in (d) of FIG. 9 and (d) of FIG. 10, when the ratio a:b of a first plating film is approximately 0.2:1, the final plating pattern is formed to have upper surfaces almost roundly formed. It may be found that when the inclination of the side surfaces of the first plating pattern, the final plating pattern is formed in an unfavorable shape.

Also, the resistance of the final coil pattern may be changed according to the shape of the first plating film. That is, in examples 1 to 3, the second plating film is formed as illustrated in (b) to (d) of FIG. 9 according to the shapes of the first plating film illustrated in (b) to (d) of FIG. 8, design resistance values and the actually measured resistance values are then compared according to the width and the height of the final coil pattern, and the results are shown in Table 1. Here, the design resistance value is the resistance when the final coil pattern has an ideal rectangular shape in which right-angle corners are formed between the upper surface and the side surfaces. That is, the ratio of the width of the lower surface to the width of the upper surface is 1:1. Also, the unit of resistance is mΩ.

As described above, in the coil pattern according to an exemplary embodiment, the first plating film 200a is formed, inclined etching is then performed such that the first plating film 200a has a predetermined inclination, and then, the second plating film 200b is formed to cover the first plating film 200a. Accordingly, the final coil pattern has vertical side surfaces and upper corners with small rounds to thereby have an almost rectangular shape. Thus, in comparison with typical arts in which a coil pattern is formed through a single process, it is possible to increase inductance and decrease resistance at the same height of the coil pattern.

Figure 11:
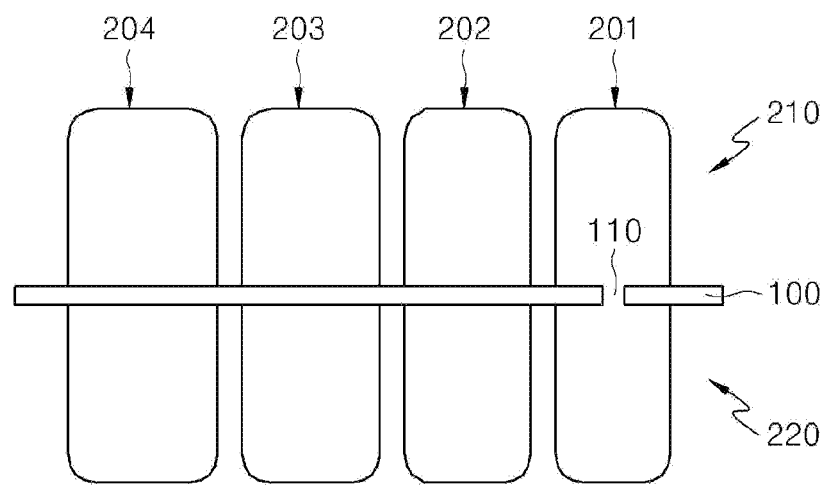
FIG. 11 is cross-sectional view of a coil pattern in accordance with another exemplary embodiment.

Meanwhile, a coil pattern according to an exemplary embodiment is formed in a spiral shape and has variously changeable width. For example, as illustrated in FIG. 11, a coil pattern 200 may be formed in a shape in which the width thereof is gradually changed from the innermost periphery thereof toward the outermost periphery thereof. That is, n coil patterns are formed from the innermost periphery to the outermost periphery. For example, when four coil patterns are formed, the widths of the coil patterns may be formed to be gradually increased from the innermost first coil pattern 201 toward second and third coil patterns 202 and 203, and the outermost fourth coil pattern 204. Here, the width of coil pattern 200 may be changed at every predetermined rotational distance. For example, the width may be changed every time when the coil pattern is rotated by one revolution from a starting point positioned on the inner peripheral portion thereof, that is, from the region in which the conductive via 110 of FIG. 1 is formed, or the width may also be changed every time when the coil pattern is rotated by a half revolution. Also, the width of the coil pattern 200 may be that of the lower surface thereof or the upper surface thereof, may also be that of any one region between the lower and upper surfaces, or may also be an average width of each coil pattern 200. Here, the width of the coil pattern

TABLE 1

| Width and height | | | | Design | Example 1 | | Example 2 | | Example 3 | |
|---|---|---|---|---|---|---|---|---|---|---|
| Width | Height | Width/height ratio | | Resis- | Resis- | Change | Resis- | Change | Resis- | Change |
| (μm) | (μm) | Width | Height | tance | tance | ratio | tance | ratio | tance | ratio |
| 135 | 140 | 1 | 1 | 30 | 30.4 | 101.4% | 31.5 | 104.8% | 32.7 | 109.2% |
| 72 | 120 | 1 | 1.67 | 55 | 55.8 | 101.4% | 57.1 | 103.8% | 59.0 | 107.3% |
| 50 | 100 | 1 | 2 | 115 | 116.4 | 101.2% | 117.3 | 102.0% | 122.5 | 106.6% |

As described above, it may be found that when the ratio of the width of the lower surface to the width of the upper surface is approximately 1:0.8, the measured resistance is not substantially changed with respect to the design resistance, and the greater the widths of the upper and lower surfaces, the greater the change in the measured resistance with respect to the design resistance. That is, in case of example 1 in which the ratio a:b of the width of the lower surface of the first plating film to the width of the upper surface of the first plating film is approximately 1:0.8, the change ratio of resistance is approximately 101%, in case of example 2 in which the ratio a:b is approximately 1:0.4, the change ratio of resistance is approximately 102% to approximately 104%, and in case of example 3 in which the ratio a:b is approximately 1:0.2, the change ratio of resistance is approximately 106% to approximately 109%.

Accordingly, in examples, the resistance characteristics are superior to those in typical arts, and in particular, when the ratio a:b is approximately 0.4:1 to approximately 0.8:1, the coil pattern is formed similar to a rectangle and has excellent resistance characteristics.

200 is assumed as the width of any one region between the lower and upper surfaces. For example, when the width of the first coil pattern 201 is 1, the second coil pattern 202 may be formed in a ratio of approximately 1 to approximately 1.5, the third coil pattern 203 may be formed in a ratio of approximately 1.2 to approximately 1.7, and the fourth coil pattern 204 may be formed in a ratio of approximately 1.3 to approximately 2. That is, the width of the second coil pattern 202 may be formed to be equal to or greater than that of the first coil pattern 201, the width of the third coil pattern 203 may be formed to be greater than that of the first coil pattern 201 and equal to or greater than that of the second coil pattern 202, and the width of the fourth coil pattern 204 may be formed to be greater than those of the first and second coil patterns 201 and 202 and equal to or greater than that of the third coil pattern 203. Consequently, the widths of the second to fourth coil patterns 202 to 204 may be respectively formed in a ratio of approximately 1:1 to approximately 1.5: approximately 1.2 to approximately 1.7: approximately 1.3 to approximately 2. In order to gradually increase the width of the coil pattern 200 from the innermost periphery toward the outermost periphery, the first plating film 200a may be formed to have a width gradually increasing from the innermost periphery the outermost periphery. Also, the distance between the first plating films 200a may be formed to be gradually increased from the innermost periphery toward the outermost periphery in consideration of the width of the final coil pattern 200. Of course, the coil pattern 200 may be formed to have a width gradually decreasing from the innermost periphery toward the outermost periphery. Meanwhile, when such a coil pattern 200 is formed on at least one surface, and favorably, on both surfaces of the substrate 100, and when coil patterns 210 and 220 (200) are formed on both surfaces of the substrate, the upper and lower coil patterns 210 and 220 may be connected to each other through a conductive via 110 formed in the substrate 100. Here, the conductive via 110 may be formed in the innermost coil pattern 201 to thereby connect the upper and lower coil patterns 210 and 220 to each other.

Coil patterns in accordance with exemplary embodiments may be used for laminated chip devices. Power inductors will be described below as the laminated chip devices which use such coil patterns according to the exemplary embodiments.

Figure 12:
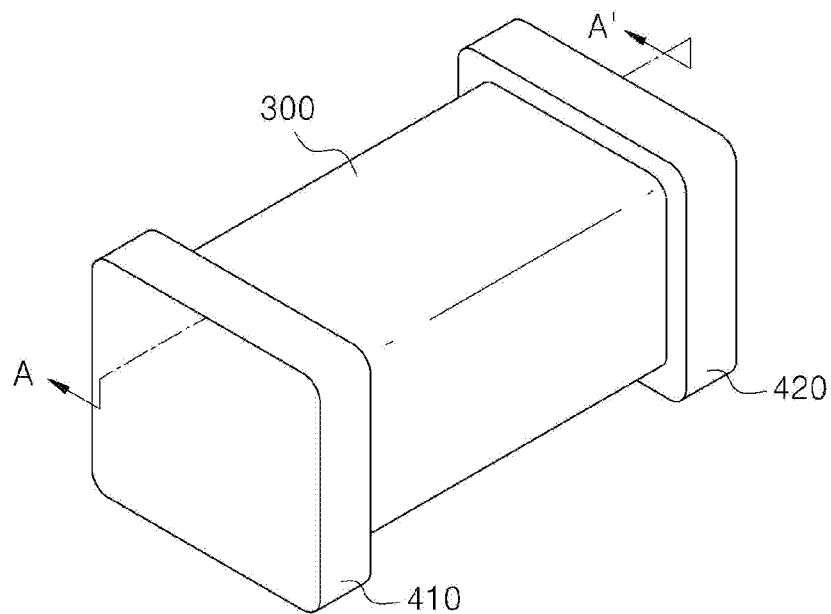
FIGS. 12 to 16 are views for describing an exemplary embodiment of a chip device, in which coil patterns in accordance with exemplary embodiments are applied.
Figure 13:
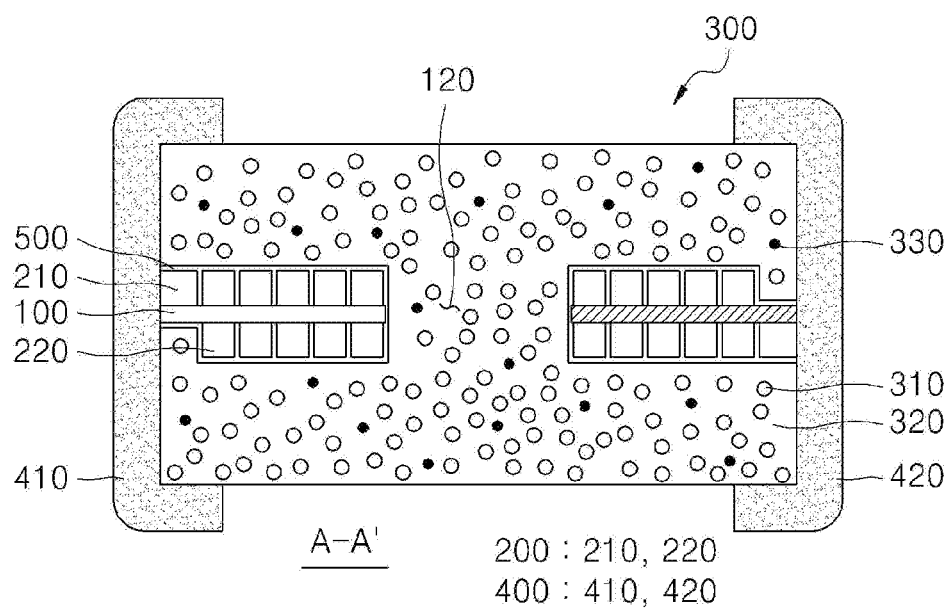
Figure 14:
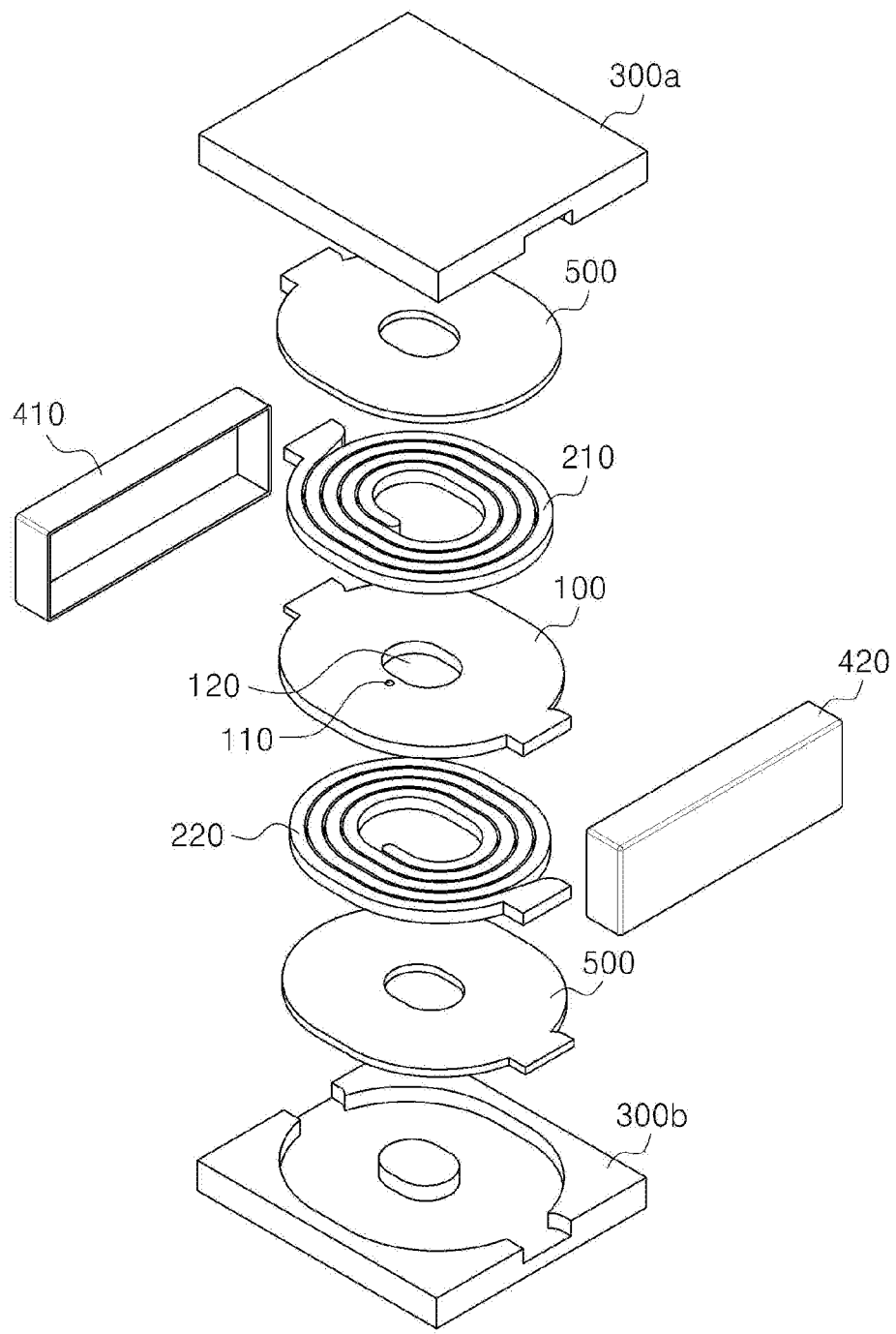
Figure 15:
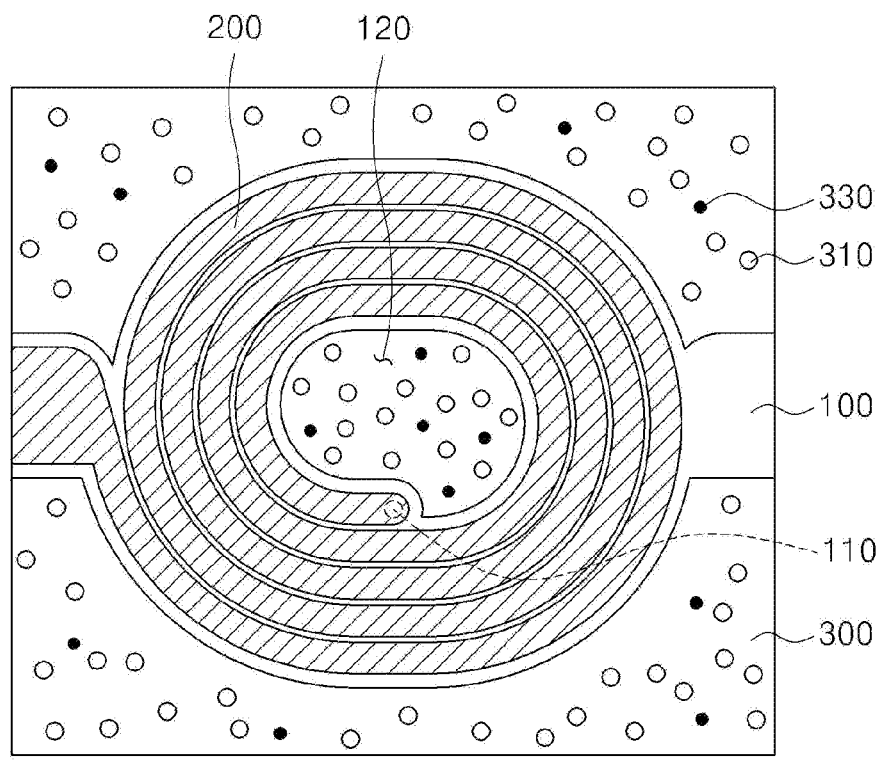
Figure 16:
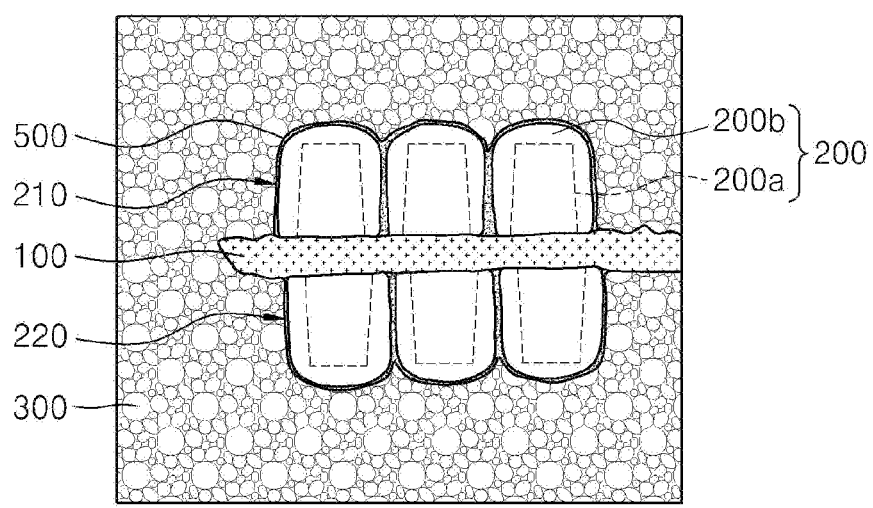

FIG. 12 is a perspective view of a power inductor assembly in accordance with an exemplary embodiment, and FIG. 13 is a cross-sectional view taken along line A-A' of FIG. 12. Also, FIG. 14 is an exploded perspective view of a power inductor in accordance with exemplary embodiment, FIG. 15 is a plan view of a substrate and a coil pattern, and FIG. 16 is a cross-sectional view of the power inductor.

Referring to FIGS. 12 to 16, a power inductor in accordance with exemplary embodiment may include bodies 300a and 300b (300), a substrate 100 provided in the body 300, coil patterns 210 and 220 (200) formed on at least one surface of the substrate 100, and external electrodes 410 and 420 (400) provided outside the body 300. Also, insulating layers 500 may be further included between the coil patterns 210 and 220 and the body 300.

The body 300 may have a hexahedral shape. Of course, the body 300 may have a polyhedral shape besides the hexahedral shape. Such a body 300 may include metal powder 310 and a polymer 320, and further include a thermally conductive filler 330.

The metal powder 310 may have the average particle diameter of approximately 1 μm to approximately 50 μm. Also, as the metal powder 310, one kind of particles with the same size or two or more kinds of particles may also be used, and alternatively, one kind of particles with a plurality of sizes or two or more kinds of particles may also be used. For example, a mixture of first metal particles having the average size of approximately 30 μm and second metal particles having the average size of approximately 3 μm may be used. Here, the first and second metal particles may be particles of the same material or different materials. When two or more kinds of metal powders 310 with sizes different from each other are used, it is possible to increase the filling ratio of the body 300. For example, when metal powder with a size of approximately 30 μm is used, voids may be present between metal powder particles with the size of approximately 30 μm, and accordingly, the filling ratio has no choice but to decrease. However, since metal powder particles with a smaller size of approximately 3 μm are added between the metal powder particles with a size of approximately 30 μm and used, it is possible to increase the filling ratio of the metal powder in the body 300. Metallic materials including iron (Fe) may be used as the metal powder 310. For example, the metallic materials may include one or more metals selected from the group consisting of iron-nickel (Fe—Ni), iron-nickel-silicon (Fe—Ni—Si), iron-aluminum-silicon (Fe—Al—Si) and iron-aluminum-chromium (Fe—Al—Cr). That is, the metal powder 310 may have a have a magnetic structure by including iron or may be formed of a metal alloy exhibiting magnetism and thus, may have predetermined magnetic permeability. Also, the metal powder may have a surface coated with a magnetic material and may be coated with a material having a magnetic permeability different from that of the metal powder 310. For example, the magnetic material may include a metal oxide magnetic material, and one or more oxide magnetic materials selected from the group consisting of a nickel oxide magnetic material, a zinc oxide magnetic material, a copper oxide magnetic material, a manganese oxide magnetic material, a cobalt oxide magnetic material, a barium oxide magnetic material, and a nickel-zinc-copper oxide magnetic material. That is, the magnetic material for coating the surfaces of metal powder 310 may be formed of metal oxides including iron and may favorably have magnetic permeability higher than that of the metal powder 310. Meanwhile, since the metal powder 310 exhibits magnetism, when particles of metal powder 310 contact each other, insulation may be broken and a short circuit may thereby be caused. Accordingly, the metal powder 310 may have surfaces coated with at least one insulating material. For example, the metal powder 310 may have a surface coated with an oxide or an insulating polymer material, such as parylene, but may favorably be coated with parylene. Parylene may be coated in a thickness of approximately 1 μm to approximately 10 μm. Here, when the parylene is formed in a thickness of less than approximately 1 μm, the insulating effect of the metal powder 310 may be decreased, and when formed in a thickness of greater than approximately 10 μm, the size of the metal powder 310 is increased and thus, the distribution of the metal powder in the body 300 is decreased, and the magnetic permeability of the body 300 may thereby be decreased. Also, the surface of the metal powder 310 may be coated by using various insulating polymer materials besides parylene. Meanwhile, an oxide for coating metal powder 310 may also be formed by oxidizing the metal powder 310, or one selected from $TiO_2$, $SiO_2$, $ZrO_2$, $SnO_2$, NiO, ZnO, CuO, CoO, MnO, MgO, $Al_2O_3$, $Cr_2O_3$, $Fe_2O_3$, $B_2O_3$ or $Bi_2O_3$ may also be applied to coat the metal powder 310. Here, the metal powder 310 may be coated with a double-structure oxide and may be coated with a double structure of an oxide and a polymer material. Of course, the surface of the metal powder 310 may also be coated with an insulating material after being coated with a magnetic material. As such, since the surface of the metal powder 310 is coated with an insulating material, short circuits caused by contact between the particles of metal powder 310 may be prevented. Here, when the metal powder 310 is coated with an oxide, an insulating polymer material, or the like, or even when doubly coated with a magnetic material and an insulating material, the metal powder 310 may be coated in a thickness of approximately 1 μm to approximately 10 μm.

The polymer 320 may be mixed with the metal powder 310 to insulate the metal powder particles from each other. That is, the metal powder 310 may have a problem in that eddy current loss under high frequencies and hysteresis loss are increased to thereby cause an increase in material loss. To reduce the material loss, the polymer 320 for insulating particles of the metal powder 310 from each other may be included. Such a polymer 320 may include one or more selected from the group consisting of epoxy, polyimide, and liquid crystalline polymer (LCP), but is not limited thereto. Also, the polymer 320 may be formed of a thermosetting resin for providing insulation between particles of metal powder 310. The thermosetting resin may include, for example, one or more selected from the group consisting of a novolac epoxy resin, a phenoxy-type epoxy resin, a BPA-type epoxy resin, a BPF-type epoxy resin, a hydrogenated BPA epoxy resin, a dimmer acid modified epoxy resin, a urethane modified epoxy resin, a rubber modified epoxy resin, and a DCPD-type epoxy resin. Here, the content of the polymer 320 included may be approximately 2.0 wt % to approximately 5.0 wt % with respect to 100 wt % of metal powder. However, when the content of the polymer 320 is increased, the volume fraction of the metal powder 310 is decreased, and thus, the effect of raising a saturation magnetization value may not be properly realized, and the magnetic permeability of the body 300 may be decreased. Conversely, when the content of the polymer 320 is decreased, a solution of strong acid or strong salt, or the like used in manufacturing process of an inductor penetrates into the inductor, and thus, inductance characteristics of the inductor may be decreased. Accordingly, the polymer 320 may be included within a range which does not decrease the saturation magnetization value and inductance of the metal powder 310.

Meanwhile, the body 300 may include a thermally conductive filler 330 to address the problem of the body 300 being heated by external heat. That is, the metal powder 310 in the body 300 may be heated by external heat, and the heat of the metal powder 310 may be discharged to the outside because the thermally conductive filler 330 is included. The thermally conductive filler 330 may include one or more selected from the group consisting of MgO, AlN, and a carbon-based material, but is not limited thereto. Here, the carbon-based material may include carbon and various shapes, for example, may include graphite, carbon black, graphene, or the like. In addition, the content of thermally conductive filler 330 included may be approximately 0.5 wt % to approximately 3 wt % with respect to 100 wt % of metal powder 310. When the content of the thermally conductive filler 330 is less than the above range, it is impossible to achieve a heat discharge effect, and when the content is greater than the above range, the content of the metal powder 310 is decreased, thereby decreasing the magnetic permeability of the body 300. Furthermore, the thermally conductive filler 330 may have a size of, for example, approximately 0.5 μm to approximately 100 μm. That is, the thermally conductive filler 330 may have the same size as that of the metal powder 310 or a size greater or smaller than the size of the metal powder 310. The thermally conductive filler 330 may have a heat discharge effect which is adjustable according to the size and the content thereof. For example, the greater the size and the content of the thermally conductive filler 330, the higher the heat discharge effect may be. Meanwhile, the body 300 may be manufactured by laminating a plurality of sheets composed of materials including the metal powder 310, the polymer 320, and the thermally conductive filler 330. Here, when the body 300 is manufactured by laminating the plurality of sheets, the content of the thermally conductive filler 330 in each sheet may be different. For example, the farther away from the substrate 100 toward the upper and lower sides, the greater the content of the thermally conductive filler 330 may be. Also, according to needs, the body 300 may be formed by applying various methods, such as a method in which a paste composed of materials including the metal powder 310, the polymer 320, and the thermally conductive filler 330 is printed in a predetermined thickness, or the paste is put into a mold and pressed. Here, in order to form the body 300, the number of laminated sheets or the thickness of the paste to be printed in a certain thickness may be determined as an appropriate number and a thickness considering required electrical characteristics, such as inductance, for a power inductor. Meanwhile, the bodies 300a and 300b provided above and below the substrate 100 with the substrate 100 disposed therebetween may be connected to each other through the substrate 100. That is, at least a portion of the substrate 100 is removed, and the removed portion may be filled with a portion of the body 300. As such, at least a portion of the substrate 100 is removed, and the removed portion is filled with the body 300 such that the area of the substrate 100 is reduced, and the ratio of the body 300 in the same volume is increased. Thus, the magnetic permeability of the power inductor may be increased.

The substrate 100 may be provided in the body 300. For example, the substrate 100 may be provided in the body 300 in the direction of the longitudinal axis of the body 300, that is, in the direction toward the external electrode 400. Also, one or more substrates 100 may be provided. For example, two or more substrates 100 may be provided so as to be spaced a predetermined distance apart from each other in the direction perpendicular to the direction in which the external electrode 400 is formed, for example, in the vertical direction. Of course, two or more substrates 100 may also be arranged in the direction in which the external electrode 400 is formed. Such a substrate 100 may be formed of, for example, copper clad lamination (CCL), metal ferrite, or the like. Here, since being formed of metal ferrite, the substrate 100 may have increased magnetic permeability and capacity which is easily achieved. That is, since CCL does not have magnetic permeability, CCL may decrease the magnetic permeability of a power inductor. However, when metal ferrite is used for the substrate 100, since having magnetic permeability, the metal ferrite does not decrease the magnetic permeability of the power inductor. Such a substrate 100 using the metal ferrite may be formed by bonding a copper foil to a plate with a predetermined thickness, the plate being formed of one or more metal selected from the group consisting of iron-nickel (Fe—Ni), iron-nickel-silicon (Fe—Ni—Si), iron-aluminum-silicon (Fe—Al—Si), and iron-aluminum-chromium (Fe—al—Cr). That is, the substrate 100 may be manufactured such that an alloy composed of at least one metal including iron is formed into a plate shape with a predetermined thickness, and a copper foil is bonded to at least one surface of a metal plate. Also, at least one conductive via 110 may be formed in a predetermined region of the substrate 100, and coil patterns 210 and 220 respectively formed above and below the substrate 100 may be electrically connected through the conductive via 110. Also, at least a portion of the substrate 100 may be removed. That is, as illustrated in FIGS. 14 and 15, in the substrate 100, the remaining region except for the region overlapping the coil patterns 210 and 220 may be removed. For example, the substrate 100 inside the coil patterns 210 and 220 formed in a spiral shape may be removed to form a through hole 120, and the substrate 100 outside the coil patterns 210 and 220 may be removed. That is, the substrate 100 may be formed, for example, in a racetrack shape along the outer shape of the coil patterns 210 and 220, and the region facing the external electrode 400 may be formed in a straight-line shape along the shape of end portions of the coil patterns 210 and 220. Accordingly, the outer side of the substrate 100 may be provided in a curved shape with respect to the body 300. The portion from which the substrate 100 is removed may be filled with the body 300 as illustrated in FIG. 15. That is, the upper and lower bodies 300a and 300b are connected to each other through the removed region including the through hole 160 in the substrate 100. Meanwhile, when the substrate 100 is formed of metal ferrite, the substrate 100 may contact the metal powder 310 of the body 300. To address such a problem, an insulating layer 500, such as parylene, may be formed on side surfaces of the substrate 100. For example, the insulating layer 500 may be formed on the side surface of the through hole 120 and the outer side surfaces of the substrate 100. Meanwhile, the substrate 100 may be provided in a width wider than the coil patterns 210 and 220. For example, the substrate 100 may remain in a predetermined width vertically under the coil patterns 210 and 220. For example, the substrate 100 may be formed so as to protrude by approximately 0.3 μm from the coil patterns 210 and 220. Meanwhile, the substrate 100 may have an area smaller than that of the horizontal cross-section of the body 300 because the regions inside and outside the coil patterns 210 and 220 are removed. For example, when the area of the horizontal cross-section of the body 300 is set to 100, the substrate 100 may be provided in an area of approximately 40 to approximately 80. When the area ratio of the substrate 100 is high, the magnetic permeability of the body 300 may be decreased, and when the area ratio of the substrate 100 is low, the formation area of the coil patterns 210 and 220 may be decreased. Accordingly, the area ratio of the substrate 100 may be adjusted considering the magnetic permeability of the body 300, the line widths and turn numbers of the coil patterns 210 and 220.

The coil patterns 210 and 220 (200) may be formed on at least one surface of the substrate 100 and may favorably be formed on both surfaces of the substrate 100. Such coil patterns 210 and 220 may be formed in a spiral shape in the outward direction from a predetermined region, for example, from the central portion of the substrate 100, and the two coil patterns 210 and 220 formed on the substrate 100 may be connected to form one coil. That is, the coil patterns 210 and 220 may be formed in a spiral shape from the outer side of the through hole 160 formed on the central portion of the substrate 100 and may be connected to each other through a conductive via 110 formed in the substrate 100. Here, the upper coil pattern 210 and the lower coil pattern 220 may be formed in the same shape as each other and may be formed in the same height as each other. Also, the coil patterns 210 and 220 may also be formed to overlap each other, and the coil pattern 220 may also be formed in a region in which the coil pattern 210 has not been formed. Meanwhile, end portions of the coil patterns 210 and 220 may outwardly extend in a straight-line shape, and may extend along the central portion of a short side of the body 300. Also, the region which is in the coil patterns 210 and 220 and contacts the external electrode 400 is formed to have a width greater than those of other regions, as illustrated in FIGS. 14 and 15. Since a portion of the coil patterns 210 and 220, that is, a lead-out part is formed in a greater width, the contact area between the coil patterns 210 and 220 and the external electrode 400 may be increased, and resistance may thereby be reduced. Of course, the coil patterns 210 and 220 may extend in the widthwise direction of the external electrode 400 in one region in which the external electrode 400 is formed. Here, an end portion of the coil patterns 210 and 220, that is, the lead-out part led out toward the external electrode 400, may be formed in a straight-line shape toward the central portion of the side surface of the body 300. Also, the coil patterns 210 and 220 may include a first plating film 200a which is formed to be inclined and a second plating film 200b formed to cover the first plating film 200a.

The external electrodes 410 and 420 (400) may be formed on two surfaces of the body 300, the two surfaces facing each other. For example, the external electrode 400 may be formed on two surfaces facing each other in the longitudinal axis direction of the body 300. Such an external electrode 400 may be electrically connected to the coil patterns 210 and 220 of the body 300. Also, the external electrode 400 may be formed on the entire two surfaces of the body 300 and may be brought into contact with the coil patterns 210 and 220 in the central portions of the two side surfaces. That is, the end portions of the coil patterns 210 and 220 are exposed to the outer central portions of the body 300, and the external electrode 400 is formed on the side surfaces of the body 300 and may thereby be connected to the end portions of the coil patterns 210 and 220. Such an external electrode 400 may be formed on both ends of the body 300 through various methods, such as a method in which the body 300 is immersed in a conductive paste, or a method of printing, deposition, or sputtering. The external electrode 400 may be formed of a metal having electrical conductivity, for example, may be formed on one or more selected from the group consisting of gold, silver, platinum, copper, nickel, palladium, and an alloy thereof. Also, the external electrode 400 may have a surface on which nickel-plated layer (not shown) or tin-plated layer (not shown) is further formed.

The insulating layer 500 may be formed between the coil patterns 210 and 220 and the body 300 to insulate the coil patterns 210 and 220 and the metal powder 310. That is, the insulating layer 500 may be formed to cover the upper and side surfaces of the coil patterns 210 and 220. In addition, the insulating layer 500 may also be formed to cover not only the upper and side surfaces of the coil patterns 210 and 220 but also the substrate 100. That is, the insulating layer 500 may also be formed on exposed region of the substrate 100 other than the coil patterns 210 and 220, that is, on the surface and side surfaces of the substrate 100. The insulating layer 500 on the substrate 100 may be formed in the same thickness as that of the insulating layer 500 on the coil patterns 210 and 220. Such an insulating layer 500 may be formed by coating the coil pattern with parylene. For example, a substrate 100 on which coil patterns 210 and 220 are formed is provided in a deposition chamber, parylene is then vaporized to thereby be supplied in a vacuum chamber. Thus, parylene may be deposited on the coil patterns 210 and 220. For example, parylene is firstly heated in a vaporizer to be vaporized and thereby converted into a dimmer state, is then secondly heated to be thermally decomposed into a monomer state, is then cooled by using a cold trap and a mechanical vacuum pump which are connected to the deposition chamber, and then is converted into a polymer state from the monomer state to be thereby deposited on the coil patterns 210 and 220. Of course, the insulating layer 500 may be formed of an insulating polymer besides parylene, for example, one or more materials selected from polyimide and liquid crystalline polymer. However, the insulating layer 500 may be formed in a uniform thickness on the coil patterns 210 and 220 by applying parylene, and even when the formed thickness is small, insulating characteristics may be improved in comparison with those of other materials. That is, when parylene is applied as the insulating layer 500, the insulating characteristics may be improved because the dielectric breakdown voltage is increased while a smaller thickness than that in the case of forming polyimide is formed. Also, the insulating layer 500 may be formed in a uniform thickness by filling gaps between patterns according to the gaps among the patterns of the coil patterns 210 and 220 or may be formed in a uniform thickness along steps of the patterns. That is, when the distances between the patterns of the coil patterns 210 and 220 are large, parylene may be applied in a uniform thickness along the steps of the patterns, and when the distances between the patterns are small, parylene may be applied in a predetermined thickness on the coil patterns 210 and 220 by filling the gap between the patterns. As illustrated in FIG. 15, parylene is formed in a small thickness along the steps of the coil patterns 210 and 220, but polyimide is formed in a greater thickness than that in case of parylene. Meanwhile, the insulating layer 500 may be formed in a thickness of approximately 3 μm to approximately 100 μm by using parylene. When parylene is formed in a thickness less than approximately 3 μm, insulation characteristics may be decreased, and when formed in a thickness greater than approximately 100 μm, the thickness occupied by the insulating layer 500 in the same size is increased. Thus, the volume of the body 300 is decreased, and thereby, magnetic permeability of the body 300 may be decreased. Of course, the insulating layer 500 may be manufactured in a sheet with a predetermined thickness and then formed on the coil patterns 210 and 220.

As described above, a power inductor in accordance with an exemplary embodiment may prevent the temperature of a body 300 from rising because the body 300 is manufactured to include not only metal powder 310 and a polymer 320 but also a thermally conductive filler 330 and is thereby capable of discharging heat of the body 300 due to heating of the metal powder 310. Thus, the problem of decrease in inductance may be prevented. In addition, an insulating layer 500 is formed by using parylene between the coil patterns 210 and 220 and the body 300, and thus, insulation characteristics may be improved while the insulating layer 500 is formed in a small and uniform thickness on the side and upper surfaces of the coil patterns 210 and 220. In addition, the magnetic permeability of the power inductor may be prevented from decreasing by forming a substrate 100 inside the body 300 by using metal magnetic materials, and the magnetic permeability of the power inductor may be improved by removing at least a portion of the substrate 100 and filling the portion with the body 300.

Meanwhile, the power inductor in accordance with exemplary embodiments may be further provided with at least one ferrite layer (not shown) in the body 300. That is, a ferrite layer may be provided on at least any one of upper and lower surfaces of the body 300, and at least one ferrite layer may also be provided in the body 300 so as to be spaced apart from the substrate 100. Such a ferrite layer may be manufactured in a sheet shape and may be provided in the body in which a plurality of sheets are laminated. That is, at least one ferrite layer may be provided between the plurality of sheets for manufacturing the body 300. Also, when the body 300 is formed by printing a paste composed of materials including the metal powder 310, the polymer 320, and the thermally conductive filler 330 in a certain thickness, the ferrite layer may be formed during printing, and when the paste is put into a mold and pressed, the ferrite layer may be put into the paste and pressed. Of course, the ferrite layer may also be formed by using a paste, and the ferrite layer maybe formed in the body 300 by applying a soft magnetic material during printing on the body 300. As such, the magnetic permeability of the power inductor may be improved by providing at least one ferrite layer on the body 300.

Also, at least two or more substrates 100 in which a coil pattern 200 is formed on at least one surface thereof may be provided in the body 300 so as to be spaced apart from each other, and the coil pattern 200 formed on the substrates 100 different from each other may be connected through an external connection electrode (not shown). Accordingly, a plurality coil patterns may be formed in one body 300, and thus, the capacity of the power inductor may be increased. That is, the coil patterns 200 respectively formed on the substrates 100 different from each other may be connected in series by using the external connection electrode, and thus, the capacity of the power inductor may be increased in the same area.

Of course, at least two or more substrates 100 are horizontally arranged, and the coil patterns 200 respectively formed on the substrates 100 are then connected through external electrodes 400 different from each other. Accordingly, a plurality of inductors may be provided in parallel. Thus, two or more power inductors may also be realized in one body 300. That is, a plurality of inductors may be realized in one body 300.

In addition, a plurality of substrates 100 on which coil patterns 200 are respectively formed at least one surface of the substrate 100 may be laminated in the thickness direction (that is, the vertical direction) of the body 300 or may be arranged in the direction (that is, the horizontal direction) perpendicular to the thickness direction. In addition, the coil patterns 200 respectively formed on the plurality of substrates 100 may be connected to the external electrodes 400 in series or in parallel. That is, the coil patterns 200 respectively formed on the plurality of substrates 100 may be connected to the external electrodes 400 different from each other in parallel, and the coil patterns 200 respectively formed on the plurality of substrates 100 may be connected to the same external electrode 400 in series. When connected in series, the coil patterns 200 respectively formed on the respective substrates 100 may be connected through the external electrodes of the body 300. Accordingly, when being connected in parallel, two external electrodes 400 are necessary to each of the plurality of substrates 100, and when being connected in series, two external electrodes 400 are necessary regardless of the number of the substrates, and one or more connection electrodes are necessary. For example, when coil patterns 200 formed on three substrates 100 are connected in parallel to external electrodes 400, six external electrodes 400 are necessary, and when coil patterns 200 formed on three substrates 100 are connected in series to external electrodes 400, two external electrodes 400 and at least one connection electrode are necessary. Also, when connected in parallel, a plurality of coils are provided in a body 300, and when connected in series, one coil is provided in the body 300.

The present invention may, however, be embodied in different forms and should not be construed as limited to the embodiments set forth herein. That is, the above embodiments are provided so that this disclosure will be thorough and complete, and will fully convey the scope of the present invention to those skilled in the art. The scope of the present invention should be interpreted by attached claims.

The invention claimed is:

1. A coil pattern formed on one or more surfaces of a substrate and comprising:
   a first plating film formed on the substrate and having a width gradually decreased from a lower surface thereof contacting the substrate toward an upper surface thereof; and a second plating film formed to cover the first plating film,
wherein the first plating film is formed such that a ratio of a width of the upper surface thereof to a width of the lower surface thereof is approximately 0.2:1 to approximately 0.9:1.

2. The coil pattern of claim 1, wherein the coil pattern is formed in a spiral shape on both surfaces of the substrate, and at least portions of the first plating film are connected through a conductive via formed on the substrate.

3. The coil pattern of claim 1, wherein the first plating film is formed such that a ratio of the width of the lower surface thereof to a height of the lower surface thereof is approximately 1:0.7 to approximately 1:4.

4. The coil pattern of claim 3, wherein a ratio of the width of the lower surface of the first plating film to the width of the lower surface of the second plating film is approximately 1:1.2 to 1:2, and a ratio of the width of the lower surface of the first plating film to a distance between adjacent first plating films is approximately 1.5:1 to approximately 3:1.

5. The coil pattern of claim 4, wherein a ratio of the width of the upper surface of the second plating film to the width of the lower surface of the second plating film is approximately 0.5:1 to approximately 0.9:1.

6. The coil pattern of claim 5, wherein the coil pattern has a resistance value of approximately 101% to approximately 110% with respect to a resistance value of a design in which a ratio of width of the upper surface of the coil pattern to the width of the lower surface of the coil pattern is 1:1.

7. The coil pattern of claim 1, wherein the coil pattern is formed to have a width gradually increased or decreased from an innermost portion thereof toward an outermost portion thereof.

8. A method of forming a coil pattern comprising:
forming a mask pattern having a predetermined shape on at least one surface of a substrate;
forming a first plating film on the substrate between the mask patterns;
etching the first plating film after removing the mask patterns; and
forming a second plating film so as to cover the first plating film.

9. The method of claim 8, wherein the coil pattern is formed in a spiral shape on each of both surfaces of the substrate, and at least portions of the first plating film are connected to each other through a conductive via formed on the substrate.

10. The method of claim 9, wherein the first plating film is etched to have a width gradually decreased from a lower surface thereof toward an upper surface thereof.

11. The method of claim 10, wherein the first plating film is etched by performing at least one isotropic etching and at least one inclined etching.

12. The method of claim 11, wherein the first plating film is etched such that a ratio of a width of the upper surface thereof to a width of the lower surface thereof is approximately 0.2:1 to approximately 0.9:1.

13. The method of claim 12, wherein the etching of the first plating film is performed in at least two intervals in which ratios of the isotropic etching to the inclined etching are differently set.

14. The method of claim 8, wherein the coil pattern is formed to have a width gradually increased or decreased from an innermost portion thereof toward an outermost portion thereof.

15. A chip device comprising:
a body;
at least one substrate provided in the body;
at least one coil pattern formed on at least one surface of the substrate; and
an insulating layer formed between the coil pattern and the body, wherein
the coil pattern is formed to have a width gradually increased or decreased from an innermost portion thereof toward an outermost portion thereof,
wherein the coil pattern comprises: a first plating film formed on the substrate; and a second plating film formed to cover the first plating film,
wherein the first plating film is formed such that a ratio of a width of an upper surface thereof to a width of a lower surface thereof is approximately 0.2:1 to approximately 0.9:1.

16. The chip device of claim 15, wherein at least some regions of the substrate are removed and the removed regions are filled with the body.

17. The chip device of claim 16, wherein at least two substrates are provided to be laminated in a thickness direction of the body, and coil patterns respectively formed on the at least two substrates are connected in series or in parallel.

* * * * *